United States Patent [19]
Kobayashi et al.

[11] Patent Number: 4,762,772
[45] Date of Patent: Aug. 9, 1988

[54] DESENSITIZING GUM FOR LITHOGRAPHIC PRINTING PLATES

[75] Inventors: Kesanao Kobayashi; Hiroshi Matsumoto, both of Shizuoka, Japan

[73] Assignee: Fuji Photo Film Co., Ltd., Kanagawa, Japan

[21] Appl. No.: 916,655

[22] Filed: Oct. 8, 1986

[30] Foreign Application Priority Data

Oct. 9, 1985 [JP] Japan ........ 60-225512

[51] Int. Cl.$^4$ ........ G03F 7/00; B41N 3/00

[52] U.S. Cl. ........ 430/309; 430/302; 106/2; 101/451; 101/465; 101/463.1

[58] Field of Search ........ 106/2, 210–213; 430/302, 309; 101/451, 465, 463

[56] References Cited

U.S. PATENT DOCUMENTS

| | | | |
|---|---|---|---|
| 3,745,028 | 7/1973 | Rauner | 106/2 |
| 3,870,527 | 3/1975 | Kryger et al. | 536/50 |
| 4,186,250 | 1/1980 | Garrett et al. | 101/465 |
| 4,200,688 | 4/1980 | Garrett et al. | 430/309 |
| 4,475,460 | 10/1984 | Matsumoto | 101/465 |
| 4,601,974 | 7/1986 | Kita | 101/465 |

FOREIGN PATENT DOCUMENTS 3336084 4/1984 Fed. Rep. of Germany .

*Primary Examiner*—Theodore Morris
*Attorney, Agent, or Firm*—Burns, Doane, Swecker & Mathis

[57] ABSTRACT

A desensitizing gum comprising an aqueous solution of water-soluble and film-forming hydroxyalkylated starch, characterized in that the degree of etherification of the hydroxyalkylated starch is 0.03 to 0.08 and the gum further contains at least one member selected from the group consisting of anionic and nonionic surfactants.

21 Claims, No Drawings

DESENSITIZING GUM FOR LITHOGRAPHIC PRINTING PLATES

FIELD OF THE INVENTION

The present invention relates to a desensitizing gum for lithographic printing plates.

BACKGROUND OF THE INVENTION

In making lithographic printing plates, a step of coating a desensitizing gum, called a gumming-up step, is provided as a final step for protecting non-image areas (areas which retain water to repel a printing ink).

The desensitizing gum is applied to non-image areas to protect the hydrophilicity of the non-image areas as well as to protect the areas from being stained or flawed by adhesion of fingerprints, fats and oils, dusts, etc. upon correction of image areas such as retouching or deletion, during storage before printing and after plate making or storage before reuse, or upon handling to mount the printing plate on a press and, in addition, to prevent oxidative stains. Known gum compositions for lithographic printing plates which include compositions comprising an aqueous solution of gum arabic, cellulose gum or a water-soluble high molecular substance containing carboxy groups in the molecule and optionally containing a pH-adjusting agent, an antiseptic, etc. have been popularly used. However, these conventionally known compositions have the following problems. That is, in the final step of finishing a printing plate, a gum solution is applied to the printing plate and spread all over the plate surface using a sponge or a cotton pad, followed by polishing the plate surface with a cotton pad or a cloth wiper until it becomes dry, upon which the water-soluble high molecular substance is thickly coated in part on image areas (areas which receive an ink). The thickly coated image areas have such a poor ink receptivity in printing that many copies must be printed before the image fully accepts ink. This phenomenon is generally called image blinding (so-called blinding). Where the above-described phenomenon takes place, the plate generally must be subjected to a washing step with water or weakly acidic solution to thereby remove the hydrophilic colloid absorbed on the image areas for reproducing image areas. This washing step consumes much time, and hence there has been developed a removing solution for desensitizing gum as described in U.S. Pat. No. 4,024,085.

The coating of image areas with fats and oils before the gumming-up step has been carried out for the purpose of protecting ink-receptive properties of the image areas. However, this makes the plate-making step complicated and deteriorates workability and, in addition, it is not preferable due to the pollution and health hazard problems. Accordingly, attempts have been made at using a water-soluble organic high molecular compound which does not causing image blinding as a desensitizing gum. For example, U.S. Pat. No. 4,095,525, and British Pat. No. 2,010,298, West German Pat. No. 2,504,594, and Soviet Pat. No. 623,755 disclose dextrin, pullulan and its derivatives, carboxy-containing polyacrylamide derivatives, methyl acrylate (or methacrylate) grafted polyacrylamide copolymer, water-soluble organic high molecular compounds etc. However, these compounds are not desirable because they exert only a poor desensitizing action on non-image areas.

SUMMARY OF THE INVENTION

It is, therefore, an object of the present invention to provide a desensitizing gum which exerts a desensitizing action on non-image areas of a lithographic printing plate and which does not cause image blinding of image areas even when the plate is stored for a long period of time.

Another object of the present invention is to provide a desensitizing gum which can be easily applied to a printing plate using a sponge, a cotton pad or an automatic gum coater, which can be easily removed from the lithographic printing plate by washing with water or bringing the plate into contact with dampening rollers on a lithographic press, and which makes it possible to maintain the hydrophilicity in non-image areas.

As a result of intensive investigations for attaining the above-described objects, the inventors have achieved the present invention.

The present invention provides a desensitizing gum for lithographic printing plate comprising an aqueous solution of water soluble and film-forming hydroxyalkylated starch, characterized in that the degree of etherification of the hydroxyalkylated starch is 0.03 to 0.08 and the gum further contains at least one member selected from the group consisting of anionic and noniodic surfactants.

Hydroxyalkylated starches (i.e. hydroxyalkyl ether of starch) used in this invention are obtained by the addition of ethylene oxide or propylene oxide to hydroxyl groups of linear (amylose) or branched (amylopectin) polymer and are high molecular compounds containing repeating units represented by the formulas I and II:

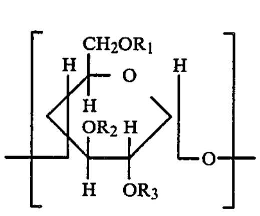

[I]

wherein $R_1$, $R_2$ and $R_3$ may be same or different and represent hydrogen atom, $$\mathrm{-(CH_2CH_2O)_{\overline{n}}H} \quad \text{or} \quad \mathrm{-(CH_2\underset{\displaystyle CH_3}{\underset{|}{C}}HO)_{\overline{n}}H}$$

and n is an integer of 1 to 3, provided that at least one of $R_1$, $R_2$ and $R_3$ is a group other than hydrogen atom.

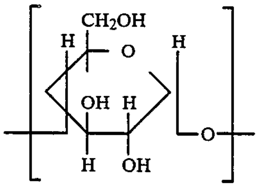

[II]

The method of the synthesis of the starch derivatives is described in detail in U.S. Pat. No. 3,067,067.

The hydroxyalkylated starches can be made easily soluble in cold water by enzymatic hydrolysis. Such enzymes include α-amylase, β-amylase, saccharogenic amylase, etc. The hydroxyalkylated starches used in this invention are those which dissolve in water at 20° C. in an amount of 30 wt. % or more, preferably 40 wt. % or more. Preferably, the hydroxyalkylated starch have such a molecular weight that an aqueous 20 wt. % solution thereof has the viscosity of 5 to 100 cps. at 20° C.

The amount of hydroxyalkylated starches contained in the desensitizing gum of the invention is about 5 to 35 wt. %, preferably 10 to 25 wt. %. The hydroxyalkylated starches are dissolved in water (usually at 20° to 25° C.) to obtain an aqueous solution which is used as a desensitizing gum.

In addition to hydroxyalkylated starches, the desensitizing gum of this invention may contain other starches such as roast dextrin, and further other waste soluble high molecular compounds such as gum arabic.

In general, when an aqueous solution of hydroxyalkylated starch having the degree of etherification (i.e. the number of hydroxy alkylated hydroxyl group present in one glucose unit) of 0.1 or less is stored, aging of the starch (i.e. increase in the viscosity of the solution) occurs. On the other hand, the optimum degree of etherification of the starch as a desensitizing gum is in the range of 0.03 to 0.08, preferably 0.04 to 0.07. For preventing the aging of the hydroxyalkylated starches having such optimum degree of etherification, the desensitizing gum of this invention contains a surfactant. Such surfactants that can be contained in the desensitizing gum of this invention are those of anionic and/or nonionic types.

Anionic surfactants include fatty acid salts, alkylsulfuric ester salts, alkylbenzenesulfonates, alkylnaphthalene sulfonates, alkylsulfosuccinates, alkylphosphoric ester salts, polyoxyethylene alkylsulfuric ester salts, naphthalenesulfuric acid—formalin condensate, alkyldiphenylether disulfonates, alkylsulfonates, fatty acid amide sulfonates. Nonionic surfactants include polyoxyethylene alkylethers, polyoxyethylene alkylphenolethers, sorbitan fatty acid esters, polyoxysorbitan fatty acid esters, polyoxyethylene sorbitol fatty acid esters, polyoxyethylene fatty acid esters, glycerin fatty acid esters, oxyethylene oxypropylene block polymers. Suitable HLB (hydrophilic-lipophilic balance) value for the nonionic surfactants is in the range of 10 to 20, particularly 12 or more.

The surfactants can be used alone or in combination. An amount of the surfactants used is not particularly limited but it is preferably 0.1 to 10 wt. % based on the weight of the desensitizing gum.

Generally, the desensitizing gum is advantageously used in an acidic condition, i.e., pH 2.5 to 6.0. For making the pH of the desensitizing gum 2.5 to 6.0, a mineral acid, an organic acid or an inorganic salt is added to the desensitizing gum in an amount of, usually, 0.01 to 2 wt. %.

Such mineral acids include nitric acid, sulfuric acid, phosphoric acid, etc. Such organic acids include citric acid, acetic acid, oxalic acid, malonic acid, n-toluene sulfonic acid, tartaric acid, malic acid, lactic acid, levulinic acid, organic phosphonic acid and such inorganic salts include magnesium nitrate, monosodium phosphate, disodium phosphate, nickel sulfate, sodium hexametaphosphate, sodium tripolyphosphate, etc. Two or more of the mineral acids, organic acids or inorganic salts can be used in combination.

In addition to the above components, a lower polyhydric alcohol such as glycerin, ethylene glycol, triethylene glycol may be used as a wetting agent. The amount of the wetting agent contained is suitably 0.01 to 5.0 wt. %, preferably 0.05 to 3.0 wt. %. Further the desensitizing gum of the invention may contain may contain an antiseptics such as benzoic acid or its derivatives, phenol, formalin, sodium dehydroacetate, etc. in an amount of 0.005 to 2.0 wt. %.

The desensitizing gum of the present invention can be applied to various lithographic printing plate. It is particularly preferable to apply it to lithographic printing plates obtained by imagewise exposing and developing presensitized plates (which will be called "PS plate" hereinafter) comprising a support of an aluminum plate having provided thereon a light-sensitive layer. Preferable examples include negative working PS plates such as those comprising an aluminum plate having provided thereon a light-sensitive layer composed of a mixture of diazo resin (salt of a condensate between p-diazodiphenylamine and paraformaldehyde) and shellac as described in British Pat. No. 1,350,521; or those comprising an aluminum support having provided thereon a light-sensitive layer composed of a mixture of diazo resin and a polymer having hydroxyethyl methacrylate units or hydroxyethyl acrylate units as major repeating units, as described in British Pat. No. 1,460,978 and 1,505,739; and positive-working PS plates comprising an aluminum plate having provided thereon a light-sensitive layer composed of a mixture of an oqunionediazide light-sensitive compound and a novolak type phenol resin, as described in U.S. Pat. No. 4,123,279. Further, PS plates comprising an aluminum plate having provided thereon a light-sensitive layer of photo-cross-linkable photopolymer specifically described in U.S. Pat. No. 3,860,426, PS plates comprising an aluminum plate having provided thereon a light-sensitive layer of photopolymerizable photopolymer composition as described in U.S. Pat. Nos. 4,072,528 and 4,072,527, and PS plates comprising an aluminum plate having provided thereon a light-sensitive layer composed of a mixture of an azide and a water-soluble polymer as described in British Pat. Nos. 1,235,281 and 1,495,861 are also preferable.

One embodiment of applying the desensitizing gum of the present invention to a PS plate is described below. However, the invention is not limited thereto.

A PS plate is first imagewise exposed to light, then developed to prepare a lithographic printing plate. This lithographic printing plate is washed with water and, after squeezing away the water on the plate surface, a suitable amount of the desensitizing gum of the present invention is applied to the plate surface, followed by rubbing the surface with a sponge so as to spread the gum solution all over the plate surface and drying. Thus, non-image areas of the printing plate are protected, and the resulting lithographic printing plate can be stored. In order to start printing, the gum on the plate surface is washed away, and subsequent procedure are conducted in a usual manner to print copies. Alternatively, an automatic gum coater may be used to uniformly apply the gum onto the plate surface. Upon printing, sufficiently satisfactory, sharp and clear copies can be obtained immediately after initiations of printing without producing many spoiled copies, which is an important improvement over the prior art.

Accordingly to this invention, it is unnecessary to use a protective ink which has been used to hold lipophilic property of image areas in making lithographc printing plates.

The invention is illustrated by the following nonlimitative examples in which percent (%) and part are by weight unless otherwise indicated.

EXAMPLE 1

200 Parts of water-soluble hydroxypropylated starch (degree of etherification: 0.05) and 15 parts of carboxymethyl cellulose (CELLOGEN 6A (trademark), produced by DAI-ICHI KOGYO YAKUHIN Co.) were dissolved in 770.3 parts of pure water. The resulting solution had the viscosity of 13 cps at 25° C. To this solution, there were added 10 parts of an aqueous 40% solution of sodium alkylsulfonate (PIONIN A-32 B (trademark), produced by TAKEMOTO YUSHI Co.), 0.2 parts of ethyl benzoate, 0.5 parts of sodium dehydroacetate and 4.0 parts of phosphoric acid (85%) to prepare a desensitizing gum of this invention. The gum was stored in a refrigerator at 3 to 5° C. for one month. No aging of the starch (i.e. the increase in the viscosity of the solution) was observed.

A 0.24 mm thick aluminum plate was degreased in an aqueous 7% trisodium phosphate solution at 60° C., washed with water and grained by rubbing with a nylon brush while applying pumice-water suspension. After washing with water, the plate was immersed in an aqueous 5% potassium silicate ($SiO_2/K_2O$ molar ratio: 2.0) solution at 70° C. for 30 to 60 seconds, washed with water and then dried.

To the plate, there was applied a light-sensitive solution consisting of 2.0 parts of 2-hydroxyethyl methacrylate copolymer (prepared by the method described in EXAMPLE 1 of British Pat. No. 1,505,739), 0.12 part of 2-methoxy-4-hydroxy-5-benzoylbenzene sulfonic acid salt of a condensate of p-diazodiphenylamine and paraformaldehyde, 0.03 part of OIL BLUE #603 (produced by ORIENT KAGAKU KOGYO), 15 parts of 2-methoxy ethanol, 10 parts of methanol and 5.0 parts of ethylene chloride so as to obtain 1.8 $g/m^2$ coating after drying. The presensitized plate thus prepared was exposed to light through a half-tone negative transparency, developed with an aqueous developer consisting of 3.0 parts of sodium sulfite, 30.0 parts of benzylalcohol, 20.0 parts of triethanolamine, 5 parts of monoethanolamine, 10 parts of sodium t-butylnaphthalene sulfonate and 1000 parts of pure water, washed with water and dried.

The printing plate thus prepared was cut into three pieces. The first one was coated with an aqueous 7° Be gum arabic solution (about 15% solution) and excess gum was wiped off with a cloth to obtain a finished printing plate (Sample A).

The second one was coated with the desensitizing gum of the present invention and excess gum was wiped off with a cloth to obtain a finished printing plate (Sample B).

The third one was not treated and designated as Sample C.

These Samples A, B and C were stored in a chamber maintained at 45° C. and 85% RH for 3 days and then installed in HEIDELBERG KOR-D printing machine. Printing was conducted in a conventional manner. With Sample A, more than 100 spoiled copies had to be printed before sharp and clear copies were printed and, with Samples B and C, 10 and 8 spoiled copies had to be printed, respectively.

As to stain during printing, Samples A and B suffered no stains, whereas Sample C was extremely easily stained. Thus, Sample B in which the desensitizing gum of this invention is used is excellent in both lipophilic property in image areas and hydrophilic property in non-image areas.

EXAMPLE 2

150 Parts of water-soluble hydroxypropylated starch (degree of etherification: 0.07), 50 parts of water-soluble hydroxyethylated starch (degree of etherification: 0.05), 30 parts of gum arabic, 12 parts of sodium polyoxyethylene alkylphenolether sulfonate (LEVENOL WZ (trademark) produced by KAO Corporation), 3 parts of an aqueous 40% sodium alkyldiphenylether disulfonate solution, 2 parts of calcium phosphate, one part of citric acid, 3 parts of phosphoric acid, one part of phenol, and 0.3 part of sodium dehydroacetate were dissolved in 747.7 parts of pure water to obtain a desensitizing gum which had the viscosity of 16 cps at 25° C. After the gum was stored for one month, almost no change in the viscosity by aging was observed.

One part of naphthoquinone-1,2-diazido-5-sulfonic ester of polyhydroxyphenyl prepared by polycondensation of pyrogallol and acetone described in U.S. Pat. No. 3,635,709 and 2 parts of novolak type cresol-formaldehyde resin were dissolved in 40 parts of methyl cellosolve to prepare a light-sensitive solution. A 0.2 mm thick aluminum plate was grained, washed with water and dried. The light-sensitive solution was coated on the aluminum plate using a whirler so as to result in a weight of about 2.0 $g/m^2$ after drying and dried to prepare a positive working presensitized plate. The plate was exposed to light through a half-tone positive transparency, developed with an aqueous 3% sodium silicate solution, washed with water and dried.

The resulting printing plate was cut into three pieces. The first one was coated with an aqueous 14° Be gum arabic solution (about 27% solution) and the second one was coated with the desensitizing gum described above and excess gum was wiped off with a cloth to obtain finished plate Samples A and B, respectively. The third one was not coated and designated as Sample C.

These samples A, B and C were stored in a chamber maintained at 45° C. and 85% RH for 7 days and then installed in HEIDELBERG KOR-D printing machine. Printing was conducted in a conventional manner. Samples A, B and C required 35, 5 and 3 spoiled copies, respectively before sharp and clear copies were printed. Background contamination was not found in Samples A and B but found frequently in Sample C. Thus, Sample B in which the desensitizing gum of this invention is used is excellent in both lipophilic property in image areas and hydrophilic property in non-image areas.

EXAMPLE 3

180 Parts of water-soluble hydroxypropylated starch (degree of etherification: 0.07), 30 parts of roast dextrin, 10 parts of a copolymer of methyl vinyl ether and maleic acid (GANTREZ S-95 (trademark), produced by GAP Corporation), 5 parts of sodium alkylsulfonate (PIONIN A-32 (trademark), produced by TAKEMOTO YUSHI Co.), 5 parts of polyoxyethylene nonyl phenyl ether (EMULGEN #985 (trademark) (HLB 18.9), produced by KAO Corporation), 3.0 parts of magnesium sulfate, 3.6 parts of formalin (37%), 0.3 parts of sodium dehydroacetate were dissolved in 760.1 parts of pure water to prepare a desensitizing gum which had the viscosity of 17 cps at 25° C. After the gum was stored for one month, no change in the viscosity by aging was observed.

In the same manner as in EXAMPLE 1, a presensitized plate was prepared, exposed to light, developed, washed with water and dried to obtain a printing plate which was cut into three pieces.

The first one was coated with an aqueous 14° Be gum arabic solution and the second one with the above desensitizing gum and excess gum was wiped off with a cloth to obtain finished plate Samples A and B, respectively. The third one was not coated and designated as Sample C.

In the same manner as in EXAMPLE 1, these Samples A, B and C were stored in a chamber maintained at 45° C. and 85% RH for 7 days and then installed in HEIDELBERG KOR printing machine. Printing was conducted in a conventional manner. With Sample A, more than 100 spoiled copies had to be printed before sharp and clear copies were printed and, with Samples B and C, 18 and 5 spoiled copies had to be printed, respectively. Background contamination was not found in Samples A and B but found frequently in Sample C. Thus, Sample B in which the desensitizing gum of this invention is used gave satisfactory results.

EXAMPLE 4

100 Parts of water-soluble hydroxyethylated starch (degree of etherification: 0.08), 100 parts of water-soluble hydroxypropylated starch (degree of etherification: 0.05), 10 parts of carboxymethyl cellulose (CELLOGEN 7A (trademark), produced by DAI-ICHI KOGYO YAKUHIN), 20 parts of gum arabic, 10 parts of polyoxyethylene sorbitan monolaurate (EMASOL L-130 (trademark) (HLB 16.7), produced of KAO Corporation), 5 parts of sodium hexametaphosphate, 3.5 parts of phosphoric acid (85%), 0.5 part of ethyl benzoate, and 0.8 part of sodium dehydroacetate were dissolved in 750.2 parts of pure water to prepare a desensitizing gum which had the viscosity of 19 cps at 25° C. After the gum was stored for one month, no change in the viscosity by aging was observed.

The printing plate prepared from the positive working presensitized plate of EXAMPLE 2 was coated with the desensitizing gum and stored at 45° C. and 85% RH for 7 days. Printing was conducted using this plate. Seven spoiled copies were required before sharp and clear copies were printed. No background contamination was observed. Thus, the desensitizing gum gave extremely satisfactory results.

What is claimed is:

1. A desensitizing gum for lithographic printing plates comprising (1) an aqueous solution of water-soluble and film forming hydroxyalkylated starch, the degree of etherification of the hydroxyalkylated starch being 0.03 to 0.08 and (2) at least one member selected from the group consisting of anionic and nonionic surfactants.

2. The desensitizing gum of claim 1, wherein said hydroxyalkylated starch contains repeating units represented by the formulas I and II:

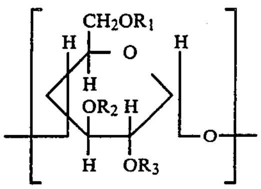
[I]

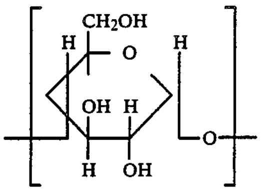
[II]

wherein $R_1$, $R_2$ and $R_3$ may be same or different and represent hydrogen atom, $(CH_2CH_2O)_nH$ or $(CH_2CHO)_nH$ and n is an integer of 1 to 3, provided that at least one of $R_1$, $R_2$ and $R_3$ is a group other than hydrogen atom.

3. The desensitizing gum of claim 1, wherein said hydroxyalkylated starch has such a molecular weight that a 20 wt. % aqueous solution thereof has the viscosity of 5 to 100 cps at 20° C.

4. The desensitizing gum of claim 1, wherein said hydroxyalkylated starch has the degree of etherification of 0.04 to 0.07.

5. The desensitizing gum of claim 1, wherein said hydroxyalkylated starch is contained in an amount of 5 to 35 wt. % based on the weight of said gum.

6. The desensitizing gum of claim 1, wherein said hydroxyalkylated starch is contained in an amount of 10 to 25 wt. % based on the weight of said gum.

7. The desensitizing gum of claim 1 further comprising a water-soluble high molecular compound.

8. The desensitizing gum of claim 1 further comprising a nonionic surfactant having HLB value of 10 to 20.

9. The desensitizing gum of claim 1, wherein said surfactant is contained in an amount of 0.1 to 10 wt. % based on the weight of said gum.

10. The desensitizing gum of claim 1 having a pH of 2.5 to 6.0.

11. The desensitizing gum of claim 1 further comprising a lubricant in an amount of 0.01 to 5.0 wt. %.

12. In a gumming-up process comprising applying to an imagewise exposed and developed presensitized plate, a desensitizing gum comprising (1) an aqueous solution of water-soluble and film forming hydroxyalkylated starch, the degree of etherification of the hydroxyalkylated starch being 0.03 to 0.08 and (2) at least one member selected from the group consisting of anionic and nonionic surfactants.

13. The process of claim 12, wherein said hydroxyalkylated starch contains repeating units represented by the formulas I and II:

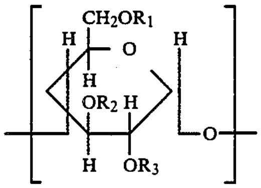
[I]

-continued

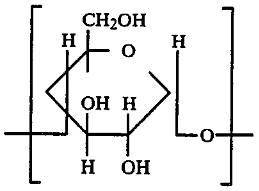

[II]

wherein $R_1$, $R_2$ and $R_3$ may be same or different and represent hydrogen atom, $-(CH_2CH_2O)_n H$ or 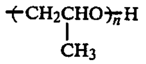

and n is an integer of 1 to 3, provided that at least one of $R_1$, $R_2$ and $R_3$ is a group other than hydrogen atom.

14. The process of claim 12, wherein said hydroxyalkylated starch has such a molecular weight that a 20 wt. % aqueous solution thereof has the viscosity of 5 to 100 cps 20° C.

15. The process of claim 12, wherein said hydroxyalkylated starch has the degree of etherification of 0.04 to 0.07.

16. The process of claim 12, wherein said hydroxyalkylated starch is contained in an amount of 5 to 35 wt. % based on the weight of said gum.

17. The process of claim 12, wherein said hydroxyalkylated starch is contained in an amount of 10 to 25 wt. % based on the weight of said gum.

18. The process of claim 12 further comprising a water-soluble high molecular compound.

19. The process of claim 12 further comprising a nonionic surfactant having HLB value of 10 to 20.

20. The process of claim 12, wherein said surfactant is contained in an amount of 0.1 to 10 wt. % based on the weight of said gum.

21. The desensitizing gum of claim 1, wherein said surfactant is selected from the group consisting of fatty acid salts, alkylsulfuric ester salts, alkylbenzenesulfonates, alkylnaphthalene sulfonates, alkylsulfosuccinates, alkylphosphoric ester salts, polyoxyethylene alkylsulfuric ester salts, naphthalenesulfuric acid formalin condensate, alkyl diphenylether disulfonates, alkylsulfonates, fatty acid amide sulfonates, polyoxyethylene alkylethers, polyoxyethylene alkylphenolethers, sorbitan fatty acid esters, polyoxysorbitan fatty acid esters, polyoxyethylene sorbitol fatty acid esters, polyoxyethylene fatty acid esters, glycerin fatty acid esters, and oxyethylene oxypropylene block polymers.

* * * * *